United States Patent [19]

Mori et al.

[11] 4,440,355
[45] Apr. 3, 1984

[54] ELECTRONIC COMPONENT SUPPLY APPARATUS

[75] Inventors: Kazuhiro Mori; Yoshihiko Misawa, both of Katano; Eiji Itemadani, Sakai; Akira Kabeshita, Miriguchi, all of Japan

[73] Assignee: Matsushita Electric Industrial Co., Ltd., Osaka, Japan

[21] Appl. No.: 351,466

[22] Filed: Feb. 23, 1982

[30] Foreign Application Priority Data

Feb. 23, 1981 [JP] Japan ................................. 56-25871

[51] Int. Cl.³ ............................................ B65H 75/02
[52] U.S. Cl. ..................................... 242/55; 226/120
[58] Field of Search ...................... 242/54, 55, 67.3 R; 226/120, 122; 221/69, 70–73, 76, 79, 81, 197, 211

[56] References Cited

U.S. PATENT DOCUMENTS

| | | | |
|---|---|---|---|
| 2,079,005 | 5/1937 | Freydberg | 221/70 |
| 2,908,909 | 10/1959 | Stolecki et al. | 221/73 X |
| 3,169,895 | 2/1965 | Sohn | 156/361 |
| 3,249,256 | 5/1966 | Stern et al. | 221/73 |
| 3,650,876 | 3/1972 | Stageberg | 156/584 |
| 3,861,560 | 1/1975 | Entwhistle et al. | 221/70 |

*Primary Examiner*—Leonard D. Christian
*Attorney, Agent, or Firm*—Birch, Stewart, Kolasch & Birch

[57] ABSTRACT

The disclosure is directed to an electronic component supply apparatus for use in an electronic component mounting arrangement, which employs an electronic component carrier tape. The apparatus is arranged to separate a covering tape from a tape base of the carrier tape only at a position directly below a vacuum chuck for picking up the component, while the covering tape is separated from the tape base so as to be wound up at a winding speed lower than an intermittent feeding speed of the carrier tape by a predetermined pitch.

8 Claims, 13 Drawing Figures

ELECTRONIC COMPONENT SUPPLY APPARATUS

BACKGROUND OF THE INVENTION

The present invention generally relates to an arrangement for mounting minute or micro-electronic parts or components onto electronic circuit boards and the like, and more particularly, to an electronic component supply apparatus which is arranged to supply such electronic components to mounting means through employment of an electronic component collective support in the form of an electronic component carrier tape in which micro-electronic components, for example, of leadless type are mounted on a belt-like long length support material such as a tape or the like at equal intervals, for making it possible to effect continuous and stable feeding of the micro-electronic components.

Conventionally, in an arrangement for mounting micro-electronic components onto a substrate constituting electronic circuits, these electronic components of leadless type, which are represented by chip type resistors, chip-type layer-built capacitors, etc., (referred to as chip type electronic components hereinbelow) are arranged to be supplied into mounting means by an aligning supply system in which separate components c are aligned by a vibrating type feeder f for feeding a magazine system in which micro-electronic components c are horizontally or vertically aligned in a magazine M and are fed one by one. Or a carrier magazine systems is utilized in which the micro-electronic components are placed in recesses r formed at equal intervals in a carrier magazine mc for feeding.

The conventional practices as described above, however, have disadvantages. In the vibrating type supply system, the vibrating type feed is employed for aligning the separate components c, there are various problems such as adverse effects to other portions due to the vibrations, requirement for a large space, clogging of the components in the course of a feeding chute, etc. While, in the magazine supply system, although the components may be supplied comparatively positively through simultaneous use of a pushing rod or the like, a considerable time is required for restoration once clogging of the components takes place, and moreover, the number of components to be stocked can not generally be increased. Further, in the carrier magazine supply system, although the components are fed smoothly in general, a carrier magazine of a large size is required for the very small electronic components, with a large space and a complicated feeding device being further required for the automatic feeding by the carrier magazine.

SUMMARY OF THE INVENTION

Accordingly, an essential object of the present invention is to provide an electronic component supply apparatus which makes it possible to effect continuous and stable supply of electronic components through employment of an electronic component collective support in the form of an electronic component carrier tape in which micro-electronic components are mounted on a belt-like long length material such as a tape or the like, with substantial elimination of disadvantages inherent in the conventional apparatuses of this kind.

Another important object of the present invention is to provide an electronic component supply apparatus of the above described type which is simple in construction and stable in functioning, and can be readily incorporated into an electronic component mounting arrangement at low cost.

In accomplishing these and other objects, according to one preferred embodiment of the present invention, there is provided an electronic component supply apparatus for use in an electronic component mounting arrangement, which employs an electronic component collective support in the form of an electronic component carrier tape including a tape base formed with a plurality of recesses or through-openings arranged at equal intervals for accommodating electronic components therein, and a covering tape fixedly adhering to one surface of the tape base for covering the recesses of the tape base. The electronic component supply apparatus includes means for intermittently feeding the electronic component carrier tape by a predetermined pitch, means for horizontally supporting the electronic component carrier tape, with the covering tape directed upward, a cover member arranged to contact the covering tape and having a predetermined thickness at its one side directed in a direction to contact the covering tape during winding thereof so as to separate the covering tape from the tape base, and means for winding up, under a predetermined tension, of the covering tape at a speed lower than the speed for intermittently feeding the tape base of the electronic component carrier tape.

By the arrangement according to the present invention as described above, an improved electronic component supply apparatus highly efficient in operation has been advantageously presented through simple construction at high reliability.

BRIEF DESCRIPTION OF THE DRAWINGS

These and other objects and features of the present invention will become apparent from the following description taken in conjunction with the preferred embodiment thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Referring now to FIGS. 1 to 8, constructions and functions of an electronic component supply apparatus according to one preferred embodiment of the present invention earlier developed by the present inventors will first be described hereinbelow.

Figure 1:
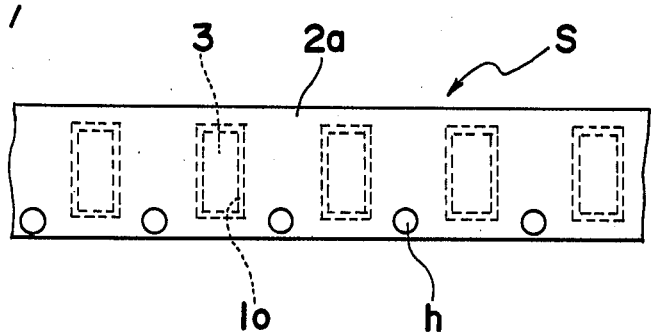
FIG. 1 is a fragmentary top plan view showing one example of a chip type component carrier tape which may be applied to the present invention.
Figure 2:
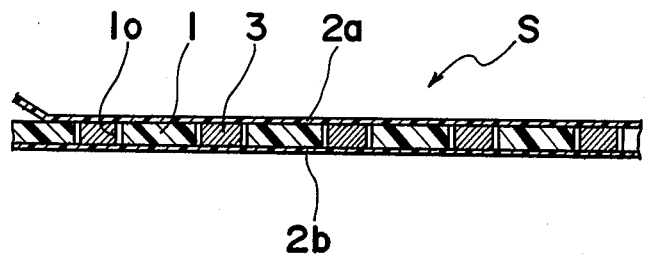
FIG. 2 is a side sectional view of the chip type component carrier tape of FIG. 1.
Figure 3:
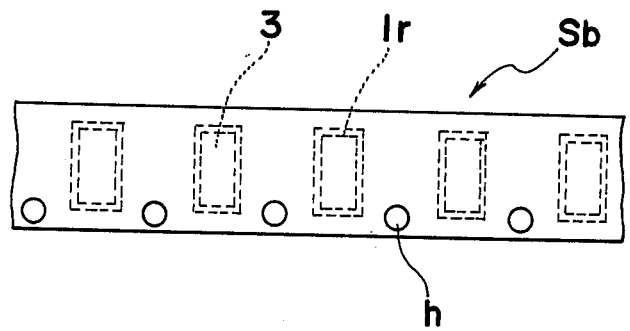
FIG. 3 is a view similar to FIG. 1, which particularly shows another example thereof.
Figure 4:
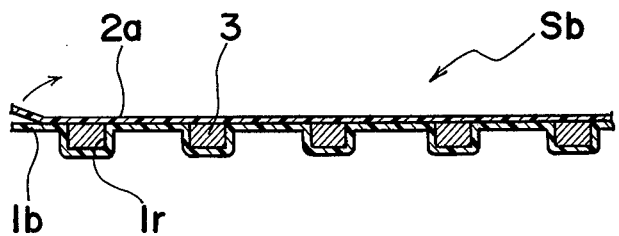
FIG. 4 is a side sectional view of the chip type component carrier tape of FIG. 6.
Figure 5:
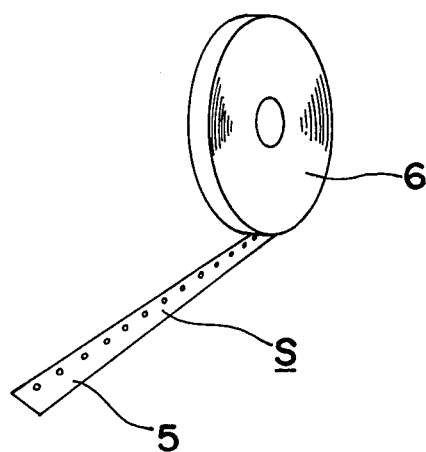
FIG. 5 is a perspective view of the chip type component carrier tape as wound on a reel for application to a taping cassette.

In FIGS. 1 and 2, there is shown an example of a belt-like long length carrier tape S for accommodating therein chip type electronic components 3. The carrier tape S includes an accommodating tape base 1 having through-openings 1o, for example, of square shape formed therein at equal intervals for accommodating therein the chip type components 3, and separate covering tapes 2a and 2b applied onto opposite surfaces of the tape base 1 for preventing the chip type components 3 from dropping off, while another group of through-holes h are provided along one side edge of the tape S so as to correspond to the pitch of positions of the components 3 accommodated in the square through-openings 1o for making it possible to effect machine feeding of the carrier tape S. Meanwhile, in a modified carrier tape Sb in FIGS. 3 and 4, the through-openings 1o described as formed in the carrier tape S in FIGS. 1 and 2 are replaced by corresponding recesses 1r formed at equal intervals in the tape base 1b, with the covering tape 2a being applied onto an upper surface of the tape base 1b as shown, while the through-holes h are similarly formed along one side edge of the carrier tape Sb. The chip type components 3 mounted on the carrier tape S (referred to as taped chip components 5 hereinbelow) are wound into a reel 6 as shown in FIG. 5, and set at a predetermined position (not particularly shown) on a table 7 of the electronic component supply apparatus shown in FIG. 6.

Figure 6:
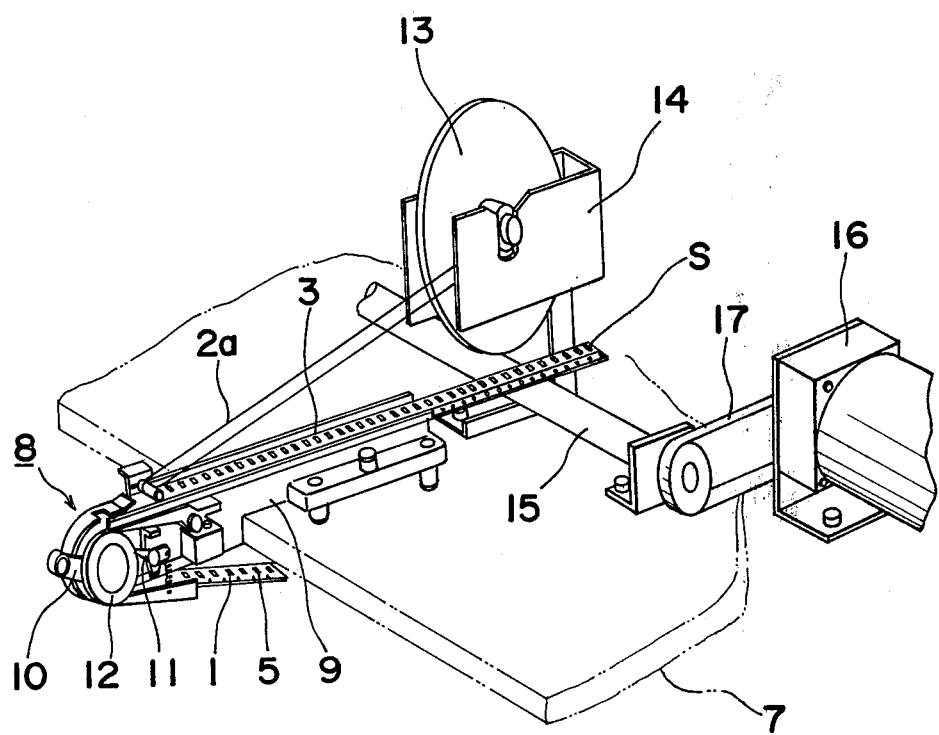
FIG. 6 is a perspective view, partly broken away, of an electronic component supply apparatus according to one preferred embodiment of the present invention.

The electronic component supply apparatus of FIG. 6 generally includes a taping cassette 8 for feeding the carrier tape S for the taped chip type components 5 from the reel 6, a reel 13 for taking up the covering tape 2a peeled off the tape base 1 of the carrier tape S, a reel bracket 14 for rotatably supporting the take-up reel 13, a rotary shaft 15 rotatably supported by a suitable bracket in contact with the peripheral edge of the take-up reel 13 for imparting rotational force to the reel 13, and a motor 16 for driving the rotary shaft 15 through a belt 17 connected between the output shaft of the motor 16 and one end of the shaft 15, all of which are disposed on the table 7 as shown.

The taping cassette 8 generally includes a body 9, a lever 10 for intermittently feeding the taped chip type components 5 by a predetermined pitch, a feeding claw 11, and a ratchet wheel 12, etc. in a manner as described hereinbelow.

Figure 7:
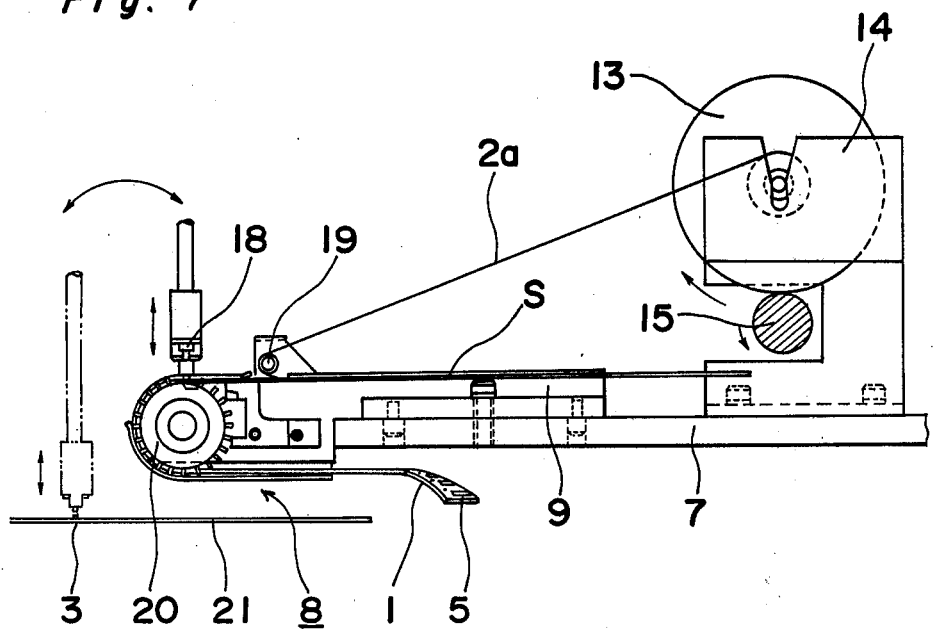
FIG. 7 is a side elevational view, partly in section, of the apparatus of FIG. 6.

Referring further to FIG. 7 showing a positional relation between the taping cassette 8 and a vacuum chuck 18 of an electronic component mounting arrangement (only the vacuum chuck 18 thereof is shown) for mounting the chip type components 3 onto a circuit substrate 21, the taped chip type components 5 in the form of the carrier tape S paid out from the reel 6 (not shown in FIG. 7) is peeled off into the tape base 1 and the covering tape 2a through a pin 19 secured on the body 9 of the taping cassette 8, and the tape base 1 directed around the peripheral surface at the forward end of the taping cassette 8 is pushed out downwardly through an intermittent rotation of a pin wheel 20 coaxially provided with the ratchet wheel 12 in a manner as described later, while the covering tape 2a is successively wound onto the take-up reel 13 imparted with rotation by the rotary shaft 15. It is to be noted that, during suspension of the intermittent feeding of the tape base 1, the take-up reel 13 is slipping with respect to the rotary shaft 15 for the winding.

In the vicinity and above the pin wheel 20 of the taping cassette 8, there is located a vacuum chuck 18 of the electronic component mounting arrangement for vertical movements at one position immediately above the taped chip components 5 fed on the taping cassette 8 for picking up a particular component 3, and at the other position before the forward end of the taping cassette 8 and directly above the circuit substrate 21 for mounting the chip type components 3 accommodated in the tape base 1 of the carrier tape S onto predetermined spots on the circuit substrate 21.

Subsequently, the mechanism for intermittently feeding the accommodating tape base 1 in the taping cassette 8 will be described hereinbelow with reference to FIGS. 7 and 8.

Figure 8:
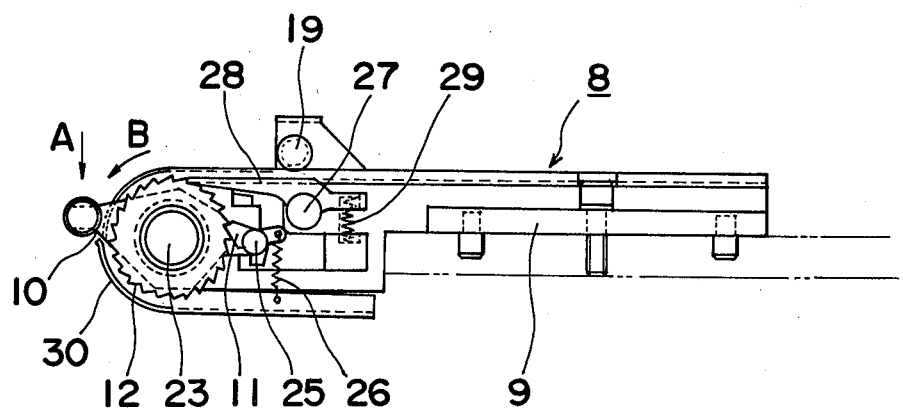
FIG. 8 is a side elevational view showing, on an enlarged scale, a main portion of a taping cassette employed in the apparatus of FIG. 6.

As shown in FIGS. 7 and 8, the taping cassette 8 includes the pin wheel 20 onto which the ratchet wheel 12 is coaxially mounted, and which is rotatably supported by a shaft 23 suitably fixed, at its one end, to the body 9 of the cassette 8, with the lever 10 being rotatably fitted around a boss portion of the pin wheel 20. A feeding claw 11 is pivotally mounted on the body 9 by a pin 25 for rotation about the pin 25 in a position corresponding, at its one end, to teeth of the ratchet wheel 12, and is normally urged clockwise by a tension spring 26 connected between the other end of the claw 11 and the body 9. In a position above the feeding claw 11, there is also provided a stopper claw 28 pivotally supported by a pin 27 secured to the body 9, and normally urged counterclockwise so as to be pressed against the ratchet wheel 12 at its one end, by a compression spring 29 connected between the other end of the stopper claw 28 and the body 9 for preventing the ratchet wheel 12 from rotation. Around the peripheral surface at the forward end of the body 9, a cover member 30 is provided in a spaced relation therefrom so as to prevent the chip type components 3 accommodated in the openings 1o of the tape base 1 from being dropped from said openings 1o.

In FIG. 8, when the forward end of the lever 10 is depressed in the direction of an arrow A, the ratchet wheel 12 is rotated by a predetermined pitch in the direction indicated by an arrow B through the feeding claw 11, and after rotation of the ratchet wheel 12 by the predetermined degree, the corresponding one end of the stopper claw 28 engages the ratchet wheel 12 to prevent the rotation of said ratchet wheel 12 in the reverse direction. In the above state, upon releasing the lever 10 from the depression, the lever 10 is restored to the original state by the tension spring 26, and at this time, the feeding claw 11 is retreated by one pitch in the engagement thereof with respect to the ratchet wheel 12. In the manner as described above, by the depressing operation of the lever 10, it becomes possible to intermittently rotate the ratchet wheel 12 by the predetermined pitch. More specifically, in FIG. 8, rotational force is transmitted from the ratchet wheel 12 to the pin wheel 20 for intermittent feeding of the accommodating tape base 1 of the carrier tape S for the taped chip type components 5.

Described so far are the constructions and functions of the electronic component supply apparatus earlier developed by the present inventors for overcoming the disadvantages of the known apparatus of this kind. The apparatus as described above, however, still has some problems as follows.

More specifically, in the apparatus earlier developed by the present inventors as described above with reference to FIGS. 6 to 8, since it is so arranged that the covering tape 2a is peeled off the tape base 1 simultaneously with the intermittent feeding of the carrier tape S by the predetermined pitch, there often takes place such a phenomenon that the chip type components 3 are partially or fully protruded or jump off from the accommodating openings 1o of the tape base 1 or they are turned over or inverted within the openings 1o, and thus, not only accuracy for mounting the components 3 onto the circuit substrate 21 by the vacuum chuck 18, but reliability for the mounting functioning itself of the components 3 are undesirably lowered in some cases.

Referring now to FIGS. 9 and 10 and FIGS. 11(a) through 11(c), an improved electronic component supply apparatus according to another preferred embodiment of the present invention will be described hereinbelow, in which the disadvantages in the arrangement as described in the foregoing have been further eliminated.

Figure 9:
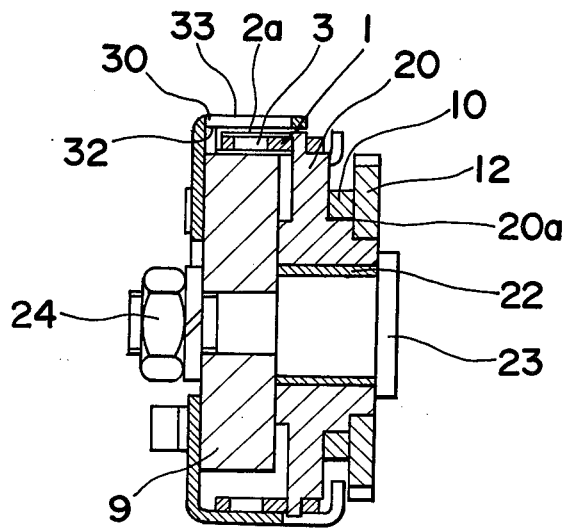
FIG. 9 is a cross section showing an essential portion of a taping cassette according to another preferred embodiment of the present invention.
Figure 10:
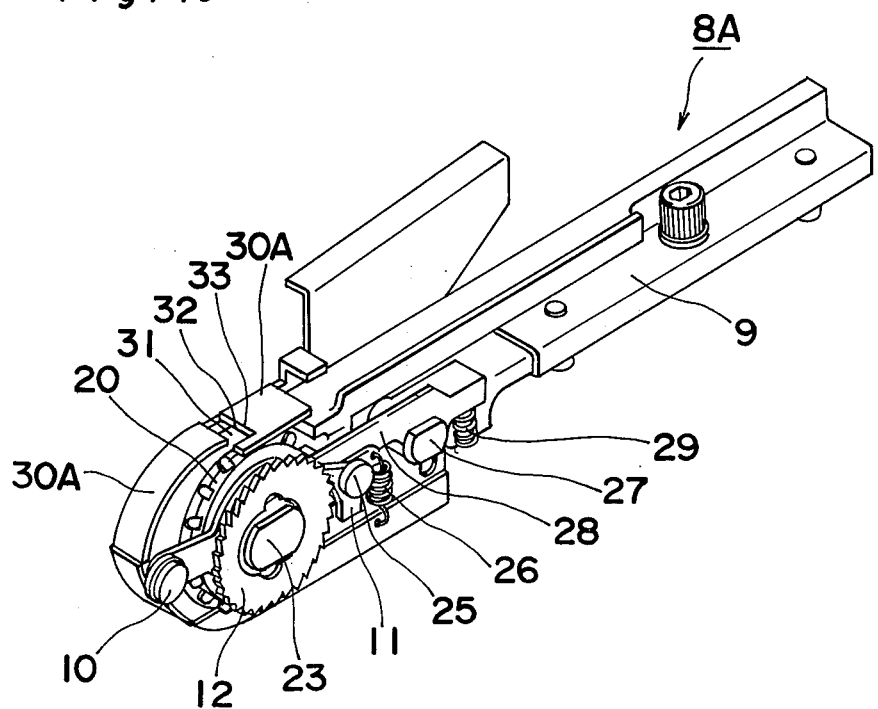
FIG. 10 is a perspective view of the taping cassette of FIG. 9, and FIGS. 11(a) to 11(c) are schematic diagrams explanatory of the principle of feeding the electronic component carrier tape for taped chip type components in the taping cassette according to the present invention.

Since the fundamental construction and functions of a taping cassette 8A and the vacuum chuck 18 employed for the apparatus of the present invention shown in FIGS. 9 and 10, are generally the same as those of the taping cassette 8 and vacuum chuck 18 in the apparatus in FIGS. 6 through 8 except for the improved structures to be described hereinbelow, like parts are designated by like reference numerals for brevity of description.

In the apparatus directly related to the present invention, as specifically shown in FIGS. 9 and 10, the taping cassette 8A includes, in the manner generally similar to the taping cassette 8 of FIGS. 6 to 8, the pin wheel 20 onto which the ratchet wheel 12 is coaxially forced for securing, and which is rotatably mounted through a bush 22 on the shaft 23 fixed, at its one end, to the body 9 of the cassette 8A by a polygonal nut 24, with the lever 10 being rotatably fitted around a boss portion 20a of the pin wheel 20. The feedingclaw 11 is pivotally mounted on the body 9 by the pin 25 for rotation about the pin 25 in a position corresponding, at its one end, to teeth of the ratchet wheel 12, and is normally urged clockwise by the tension spring 26 connected between the other end of the claw 11 and the body 9. In a position above the feeding claw 11, the stopper claw 28 is pivotally supported by a pin 27 secured to the body 9, and normally urged counterclockwise so as to be pressed against the ratchet wheel 12 at its one end, by the compression spring 29 connected between the other end of the stopper claw 28 and the body 9 for preventing the ratchet wheel 12 from rotation. Around the peripheral surface at the forward end of the body 9, a cover member 30A is provided in a spaced relation therefrom so as to prevent the chip tape components 3 accommodated in the openings 1o of the tape base 1 from being dropped from said openings 1o.

In the taping cassette 8A of FIGS. 9 and 10 directly related to the present invention, the pin 19 described as employed in the taping cassette 8 of FIGS. 6 to 8 is replaced by a notch 31 formed in the cover member 30A for covering the forward peripheral surface of the taping cassette 8A, in a position directly below the vacuum chuck 18 (not shown here) which is located at its one position for picking up the chip type components 3. The notch 31 of generally rectangular configuration has such a size as will allow only one piece of the chip type components 3 to be exposed from the tape base 1 for the taped chip type components 5, and is provided, at its one side remote from the forward end of the taping cassette 8A, with a lower edge 32 and an upper edge 33 so as to separate the cover tape 2a from the tape base 1 for the carrier tape S through said two edges 32 and 33.

Figure 11A:
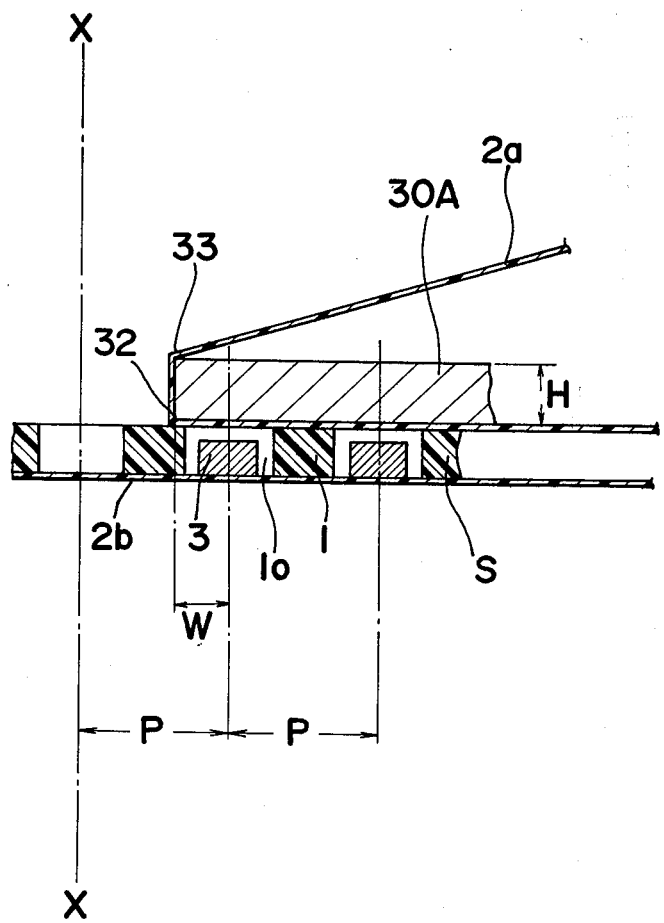
Figure 11B:
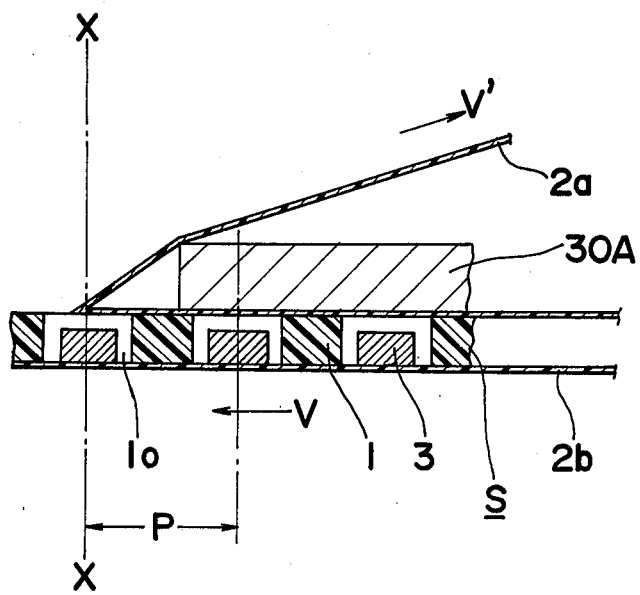
Figure 11C:
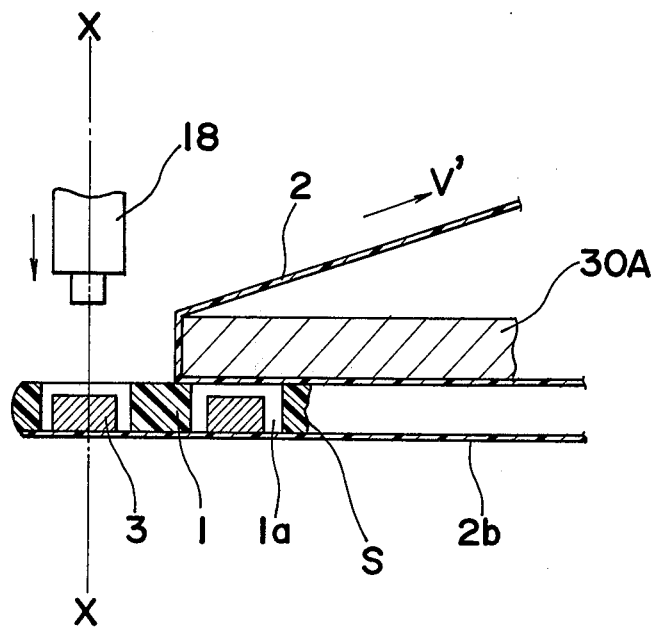

With particular reference to FIGS. 11(a) to 11(c), the principle for separating the cover tape 2a from the tape base 1 in the apparatus of FIGS. 9 and 10 will be described hereinbelow.

In FIG. 11(a) showing the state before the carrier tape S is intermittently fed by the predetermined pitch, a vertical line X—X represents a position where the chip type component 3 is attracted by the vacuum chuck 18.

In the above state, the chip type components 3 accommodated in the accommodating openings 1o of the tape base 1 are covered by the upper covering tape 2a, with said covering tape 2a still adhering to the surface of the tape base 1 due to presence of the cover member 30A having the notch 31 with the two edges 32 and 33 at its one side as described earlier.

In the state of FIG. 11(a), the distance between the center of the through-openings 1o and the one side of the notch 31 having the two edges 32 and 33 is represented by W, while the thickness of the cover member 30A at said notch 31 is denoted by H, and the pitch for intermittently feeding the tape base 1 of the carrier tape S is represented by P.

Meanwhile, in FIG. 11(b) illustrating the state immediately after the tape base 1 is intermittently fed by the predetermined pitch P, the intermittent feeding speed by the predetermined pitch P for the tape base 1 is denoted by V, while the winding up speed of the covering tape 2a by the take-up reel 13 (FIGS. 6 and 7) is represented by V'.

It should be noted here that, in the above case, if the speeds are set in the relation V>V', and the covering tape 2a above the chip type component 3 to be attracted by the vacuum chuck 18 is arranged to cover more than half of the particular accommodating opening 1o immediately after completion of the intermittent feeding of the tape base 1 in a time period T, the chip type component 3 may be fed by the predetermined pitch without jumping out of the accommodating opening 1o of the tape base 1. In other words, it is necessary to determine the distances H and W and the winding speed V' of the covering tape 2a to establish the relation as follows.

$$H + W > \sqrt{H^2 + (P-W)^2} + V \cdot T$$

Under the above set conditions, the covering tape 2a is slowly separated from the tape base 1 after the carrier tape S is intermittently fed by the predetermined pitch, and the chip type component 3 stably accommodated in the accommodating opening 1o of the tape base 1 is positively attracted in the regular attitude or posture by the vacuum chuck 18 so as to be subsequently mounted on the circuit substrate 21 (FIG. 11(c).

As is clear from the foregoing description, according to the arrangement of the present invention, since the separation of the covering tape from the tape base of the carrier tape is effected only at the position directly below the vacuum chuck, while the covering tape tape is separated from the tape base for being wound up at the winding speed lower than the intermittent feeding speed of the carrier tape by the predetermined pitch, the separation of the covering tape from the tape base is slowly effected after completion of the feeding function of the tape base, and therefore, the undesirable jumping out of the chip type components from the accommodating openings or inversion thereof in such accommodating openings of the tape base is advantageously eliminated, thus making it possible to effect continuous and stable supply of the chip type components at high reliability, with a simultaneous marked improvement on the dependability in the attracting and mounting functions of the electronic component mounting arrangement.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. An electronic component supply apparatus for use in an electronic component mounting arrangement, which employs an electronic component collective support in the form of an electronic component carrier tape including a tape base formed with a plurality of recesses arranged at equal intervals for accommodating electronic components therein, and a covering tape fixedly adhering to one surface of said tape base for covering said recesses of said tape base, said electronic component supply apparatus comprising means for intermittently feeding said electronic component carrier tape by a predetermined pitch, means for horizontally supporting said electronic component carrier tape, with said covering tape positioned upward in respect to said tape base, a cover member arranged to contact said covering tape during winding thereof so as to separate said covering tape from said tape base and having a predetermined thickness, and means for winding up, under a predetermined tension, of said covering tape at a speed lower than the speed for intermittently feeding said tape base of said electronic component carrier tape.

2. An electronic component supply apparatus as claimed in claim 1, wherein the speed for winding up said covering tape and thickness of said cover member are so determined as to be in a relation represented by $$H + W > \sqrt{H^2 + (P - W)^2} + V' \cdot T$$

wherein T is a time for the intermittent feeding of said electronic component carrier tape, V' is the speed for winding up the covering tape, P is the intermittent feeding pitch of said tape base of the electronic component carrier tape, H is the thickness at its edge side of the cover member, and W is a distance between a center of the recess and its edge side of said cover member.

3. An electronic component supply apparatus as claimed in claim 1, wherein said recesses formed in said tape base are through-openings in which the electronic components are accommodated, with another covering tape being applied to the other surface of said tape base for supporting the electronic components in said through-openings.

4. An electronic component supply apparatus as claimed in claim 1, wherein said means for intermittently feeding said electronic component carrier tape includes a ratchet wheel and claw arrangement incorporated in a taping cassette employed in said electronic component supply apparatus.

5. An electronic component supply apparatus as claimed in claim 4, wherein said means for horizontally supporting said electronic component carrier tape is one edge provided on an upper portion of said taping cassette along which said electronic component carrier tape is intermittently fed.

6. An electronic component supply apparatus as claimed in claim 5, wherein said cover member is fixedly mounted on the taping cassette in a spaced relation from said one edge of said taping cassette to allow said electronic component carrier tape to pass therebetween.

7. An electronic component supply apparatus as claimed in claim 1, wherein its edge side of said cover member is formed by forming a notch in said cover member, and is provided with an upper edge and lower edge for contact with said covering tape of said carrier tape during separation of said covering tape from said tape base for winding up said covering tape.

8. An electronic component supply apparatus as claimed in claim 1, wherein said electronic components to be dealt with are chip type electronic components.

* * * * *